United States Patent [19]

Green

[11] 4,079,183

[45] Mar. 14, 1978

[54] POLYMERIZABLE ESTERS

[75] Inventor: George Edward Green, Cherry Hinton, England

[73] Assignee: Ciba-Geigy Corporation, Ardsley, N.Y.

[21] Appl. No.: 633,770

[22] Filed: Nov. 20, 1975

[30] Foreign Application Priority Data

Nov. 30, 1974 United Kingdom .............. 51972/74

[51] Int. Cl.$^2$ ........................ C07C 69/76; G03C 5/00
[52] U.S. Cl. ........................................ 560/52; 560/80;
560/85; 560/117; 560/122; 260/332.2 R;
260/332.3 R; 260/346.74; 260/347.4;
260/347.8; 260/502.4 R; 260/511; 260/512 C;
260/590 D
[58] Field of Search .................................. 260/475 P

[56] References Cited

U.S. PATENT DOCUMENTS 3,573,215  3/1971  Nametz et al. .................. 260/475 P Primary Examiner—Alan M. Siegel
Attorney, Agent, or Firm—Luther A. R. Hall

[57] ABSTRACT

The esters are soluble in an aqueous solution of a base before exposure to actinic radiation but, on exposure to actinic radiation, polymerize and become insoluble in such an aqueous solution. Development of photopolymerized images does not therefore require the use of toxic or flammable organic solvents. They contain free carboxyl groups and at least one unit of the formula 1-IV

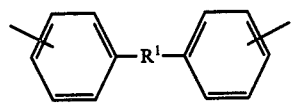

I

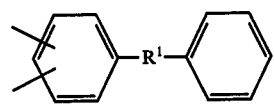

II

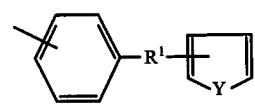

III

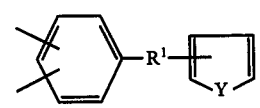

IV where $R^1$ is a carbon atom chain containing specified groupings, such as one of formula —CH=CH—CO—CH=CH—, —CH=CHCO—, —COCH=CHC$_6$H$_4$CH=CHCO—, or

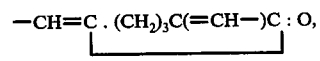

—CH=C . (CH$_2$)$_3$C(=CH—)C : O, and Y is oxygen or sulfur.

They are obtained by the reaction of an at least dianhydride of a polycarboxylic acid with alcoholic hydroxyl groups of an alcohol containing at least one unit of formula I-IV.

8 Claims, No Drawings

POLYMERIZABLE ESTERS

DETAILED DISCLOSURE

THIS INVENTION relates to esters which polymerise on exposure to actinic radiation, to methods of preparing them and of polymerising such esters by means of actinic radiation, to supports bearing thereon such an ester in the polymerisable state, and to supports bearing thereon an ester polymerised by means of actinic radiation.

Substances capable of becoming polymerised on exposure to actinic radiation are used in, for example, the preparation of printing plates for offset printing and of printed circuits, and for coating metals, such as in the manufacture of cans (see, e.g. Kosar, "Light-sensitive systems: Chemistry and Applications of non-silver halide photographic Processes", Wiley, New York, 1965; Delzenne, "Synthesis and Photocrosslinking of Light-Sensitive Polymers" in European Polym. J. Suppl., 1969, pp. 55–91; Williams, "Photopolymerisation and Photocrosslinking of Polymers" in Forschr. chem. Forsch., Vol. 13 (2), 227–250). There are various drawbacks in the substances presently available which may be polymerised by exposure to actinic radiation. Some are so unstable that they must be applied to a substrate only immediately prior to exposing them to actinic radiation. Others are relatively insensitive and need lengthy exposure to actinic radiation in order to become sufficiently polymerised. Others, after being polymerised, are not resistant to etching baths used in subsequent processes.

In most cases the reproduction of an image is desired; a layer of the polymerisable material is exposed to actinic radiation imagewise as through a negative and then "developed" by being washed with a suitable liquid, such as perchloroethylene, methylene chloride, ethylene dichloride, acetone, ethyl methyl ketone, cyclohexanone, n-propanol, ethanol, toluene, benzene, ethyl acetate, and mixtures thereof, to dissolve and remove that portion of the layer which was not polymerised by exposure to actinic radiation.

However, the use of such organic solvents is often undesirable, on grounds of their flammability or toxicity, and so the need exists for substances which may be polymerised by means of actinic radiation and then "developed" by aqueous media.

It has now been found that by using certain novel esters the aforesaid disadvantages of materials previously available for polymerisation by actinic radiation can be at least substantially overcome.

One aspect of this invention accordingly provides esters which are soluble in an aqueous solution of a base before exposure to actinic radiation but which, on exposure to actinic radiation, polymerise and become insoluble in such an aqueous solution, the said esters containing free carboxyl groups and at least one unit of the formula

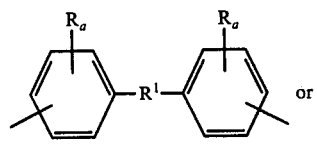 I

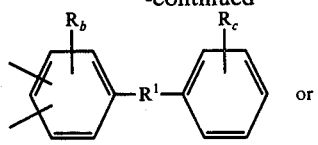 II or

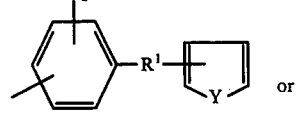 III or

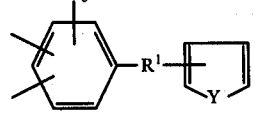 IV where
each R represents a halogen atom, an alkyl, cycloalkyl, alkenyl, cycloalkenyl, alkoxy, alkenoxy, carbalkoxy, carbalkenoxy, carbocycloalkoxy, or carbocycloalkenoxy group of 1 to 9 carbon atoms, a nitro group, or a carboxyl or sulphonic acid or phosphonic acid group in the form of a salt,
each $a$ represents zero or an integer of 1 to 4,
$b$ represents zero or an integer of 1 to 3,
$c$ represents zero or an integer of 1 to 5, and
$R^1$ represents a chain of carbon atoms containing in that chain a grouping of formula

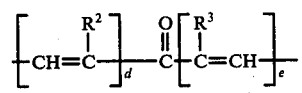 V or

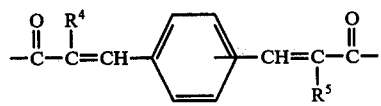 VI or

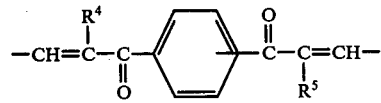 VII wherein
$R^2$ and $R^3$ individually are each a hydrogen atom, and alkyl group of 1 to 4 carbon atoms, or a phenyl group, or conjointly denote a polymethylene chain of 2 to 4 methylene groups,
$R^4$ and $R^5$ are each a hydrogen atom, an alkyl group of 1 to 4 carbon atoms, or a phenyl group,
Y denotes an oxygen or sulphur atom, and
$d$ and $e$ are each zero, 1, or 2, with the proviso that they are not both zero,
the unit of formula I to IV being linked by an indicated free valency through an oxygen atom to a carbon atom and by the other indicated free valency, if present, to a hydrogen atom or, through an oxygen atom, to a carbon atom,
obtained by the reaction of an at least dianhydride of a polycarboxylic acid with alcoholic hydroxyl groups of an alcohol containing, per average molecule, at least one unit of formula I to IV linked as aforesaid.

Preferably the esters contain from 10 to 50% by weight of units of any of the formulae I to IV and preferably the units of formula III and of formula IV are further of the formulae

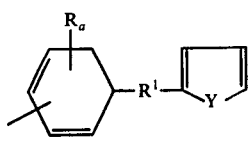 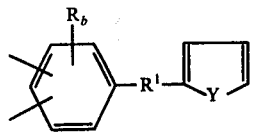

IIIA             IVA respectively.

The reaction of the dianhydride with the alcohol is carried out with the formation of free carboxyl groups: by using an at least dianhydride, reaction with alcoholic hydroxyl groups in two or more molecules of the alcohol is possible, resulting in formation of a higher molecular weight material of superior film-forming properties. Usually, the alcohol and the dianhydride are heated at 80° to 150° C for from one half to three hours in an inert solvent (such as cyclohexanone) and in the presence of a catalyst for the esterification such as a tertiary amine (a specific example being N-benzyldimethylamine): the disappearance of anhydride groups can be monitored by inspection of infra-red spectra of the reaction mixture. Usually, too, from 0.7 to 1.2 carboxylic acid anhydride equivalents of the dianhydride are used per alcoholic hydroxyl group of the alcohol.

Preferably the dianhydrides are those of acids containing not more than four carboxylic acid groups, such as benzophenone-3,3′,4,4′-tetracarboxylic acid dianhydride, cyclopentane-1,2,4,5-teteracarboxylic acid dianhydride, pyromellitic acid dianhydride, 3,4-dicarboxy-1,2,3,4-tetrahydronaphth-1-ylsuccinic acid dianhydride, 5,6,9,10-tetracarboxytricyclo[6,2,2,0$^{2,7}$]dodeca-2,11-diene dianhydride, naphthalene-2,3,6,7-tetracarboxylic acid dianhydride, and compounds of the formula

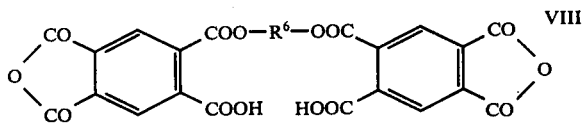

VIII where R$^6$ is the residue of a glycol after removal of two alcoholic hydroxyl groups.

It is convenient to use, as the alcohol containing the group of formula I, II or IV, the addition product of a compound containing one or more 1,2-epoxide groups with a phenol of formula

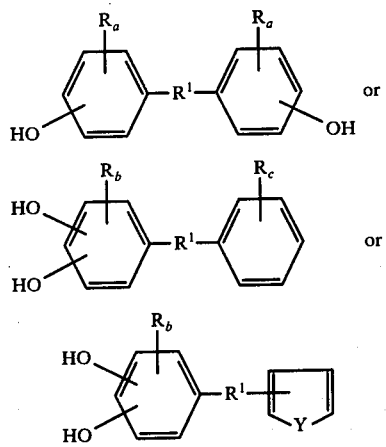

IX or

X or

XI where the symbols have the meanings previously assigned.

In such an addition product the epoxide groups have been opened and secondary hydroxyl groups have been formed, e.g.:-

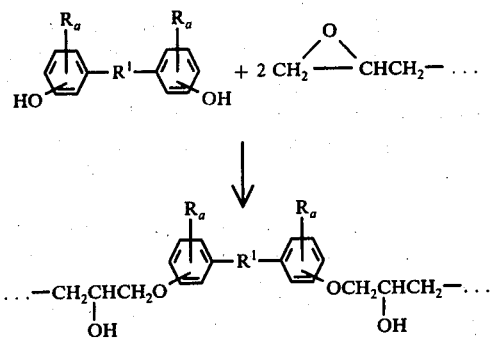

Of course, as already indicated, a compound containing more than one epoxide group can be used.

Similarly, a monohydric phenol of formula

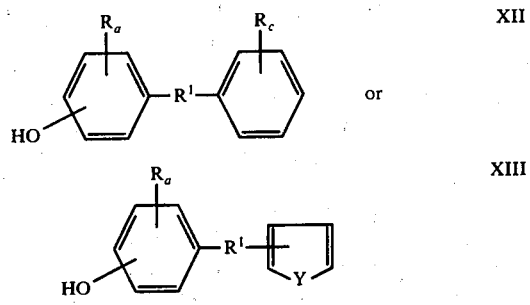

XII or

XIII where the symbols have the meanings previously assigned, may be used to form the alcohol containing the groups II and III. (Formulae XII, XV, and XXVII relate to esters in which one of the indicated free valencies in a unit of formula I is satisfied by a hydrogen atom.)

Preferably the phenols of formulae XI and XIII are further of the formulae

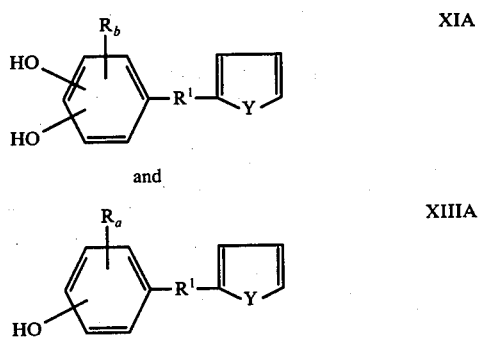

XIA and

XIIIA respectively.

This ring-opening reaction is preferably carried out in the presence of a catalyst and of an inhibitor of free radical-induced polymerisation. Suitable catalysts include tertiary amines, such as N-benzyldimethylamine and triethylamine, and quaternary ammonium salts such as tetramethylammonium chloride and tetraethylammonium bromide. A convenient inhibitor of free radical-induced polymerisation is hydroquinone. The addition reaction is generally carried out at an elevated temperature, e.g., 80° to 120° C, and in an inert solvent, and usually from 0.75 to 1.25 phenolic hydroxyl equivalents of the phenol per 1,2-epoxide group are used.

A wide range of epoxides can be used in the reaction with the phenols of formulae IX to XIII.

As examples of suitable polyepoxides may be mentioned polyglycidyl esters obtainable by reaction of a compound containing two or more free carboxyl groups per molecule with epichlorohydrin or glycerol dichlorohydrin in the presence of an alkali. Such polyglycidyl esters may be derived from aliphatic polycarboxylic acids, e.g., glutaric acid, adipic acid, pimelic acid, suberic acid, azelaic acid, sebacic acid, or dimerised or trimerised linoleic acid; from cycloaliphatic acids such as tetrahydrophthalic acid, 4-methyltetrahydrophthalic acid, hexahydrophthalic acid, and 4-methylhexahydrophthalic acid; and from aromatic acids such as phthalic acid, isophthalic acid, and terephthalic acid.

There may also be used polymers of glycidyl esters of ethylenically unsaturated acids and copolymers of such glycidyl esters with a second ethylenically unsaturated compound. Suitable polymers and copolymers include poly(glycidyl acrylate), poly(glycidyl methacrylate) and copolymers of an α-mono-olefin such as styrene or methyl methacrylate with glycidyl acrylate or glycidyl methacrylate.

Further examples are glycidyl ethers obtainable by reaction of a compound containing free alcoholic hydroxyl and/or phenolic hydroxyl groups per molecule with the appropriate epichlorohydrin or glycerol dichlorohydrin under alkaline conditions or, alternatively, in the presence of an acidic catalyst and subsequent treatment with alkali. These ethers may be made from acyclic alcohols such as ethylene glycol, diethylene glycol, and higher poly(oxyethylene) glycols, propane-1,2-diol and poly(oxypropylene) glycols, propane-1,3-diol, butane-1,4-diol, poly(oxytetramethylene) glycols, pentane-1,5-diol, hexane-1,6-diol, hexane-2,4,6-triol, glycerol, 1,1,1-trimethylolpropane, pentaerythritol, sorbitol, and poly(epichlorohydrin); from cycloaliphatic alcohols such as resorcitol, quinitol, bis(4-hydroxycyclohexyl)methane, 2,2-bis(4-hydroxycyclohexyl)propane, and 1,1-bis(hydroxymethyl)cyclohex-3-ene and from alcohols having aromatic nuclei, such as N,N-bis(2-hydroxyethyl)-aniline and p,p'-bis(2-hydroxyethylamino)diphenylmethane. Or they may be made from mononuclear phenols, such as resorcinol and hydroquinone, and from polynuclear phenols, such as bis(4-hydroxyphenyl)methane, 4,4'-dihydroxydiphenyl, bis(4-hydroxyphenyl) sulphone, 1,1,2,2-tetrakis(4-hydroxyphenyl)ethane, 2,2-bis(4-hydroxyphenyl)propane (otherwise known as bisphenol A), 2,2-bis(3,5-dibromo-4-hydroxyphenyl)-propane, and novolaks formed from aldehydes such as formaldehyde, acetaldehyde, chloral, and furfuraldehyde, with phenols such as phenol itself and phenol substituted in the ring by one or more chlorine atoms or by alkyl groups each containing up to nine carbon atoms, such as 4-chlorophenol, 2-methylphenol, and 4-tert.butylphenol.

Poly(N-glycidyl) compounds which may be used include the glycidyl derivatives of amines, such as bis(4-aminophenyl)methane and bis(4-aminophenyl) sulphone, and also the N-glycidyl derivatives of cyclic ureas, such as those of isocyanuric acid, hydantoins, uracils, dihydrouracils, parabanic acids, bis(hydantoin-1-yl)alkanes, ethydeneureas (imidazolidin-2-ones), and 1,3-propyleneureas (hexahydro-2H-pyrimidin-2-ones).

Examples of poly(S-glycidyl) compounds are the tris(S-glycidyl) derivatives, described in United Kingdom Patent Specification No. 1352527, of cyclododecanetrithiols prepared from cyclododeca-1,5,9-triene.

Polyepoxides having terminal 1,2-epoxide groups attached to different kinds of hetero atoms may also be employed, e.g., the N,N,O-triglycidyl derivative of p-aminophenol.

There may also be used polyepoxides in which the 1,2-epoxide groups are not terminal, as in 3-(3',4'-epoxycyclohexyl)-2,4-dioxaspiro[5,5]-8, 9-epoxyundecane and 3,4-epoxycyclohexyl 3',4'-epoxycyclohexanecarboxylate and its 6,6'-dimethyl derivative.

As examples of suitable monoepoxides may be mentioned ethylene and propylene oxides, epichlorohydrin, glycidyl acetate, glycidyl acylate and methacrylate, and methyl, ethyl, n-butyl, phenyl, o-, m-, and p-cresyl glycidyl ethers.

Preferably the epoxide contains glycidyl groups attached to oxygen, nitrogen, or sulphur, i.e., the alcoholic hydroxyl groups which react with the dianhydride are present in groups of the formulae XIV to XVIII

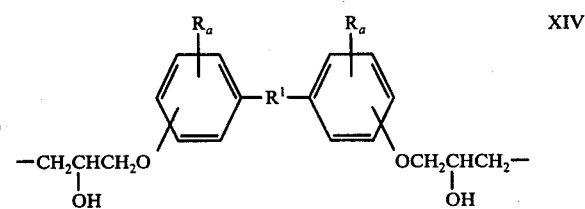

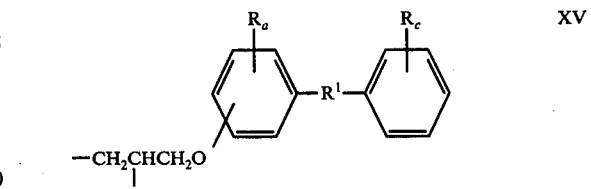

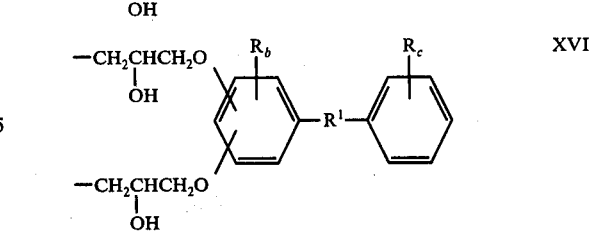

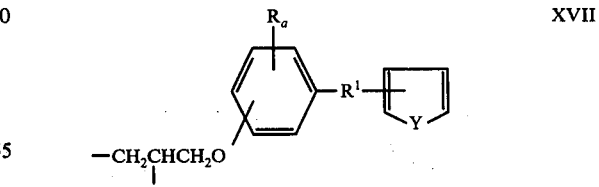

or

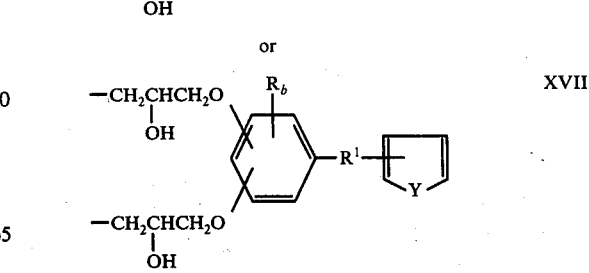

attached to oxygen, nitrogen, or sulphur atoms, and particularly preferred are the alcohols in which such groups are directly attached to oxygen atoms which are part of the residue of a phenol or of an alcohol after removal of one or two hydrogen atoms or are directly attached to one or two nitrogen atoms which are part of the heterocyclic ring of a cyclic urea.

In the foregoing formulae, $R^1$ preferably represents a group of formula

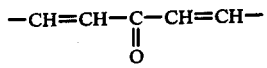         XIX

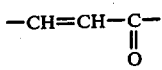         XX

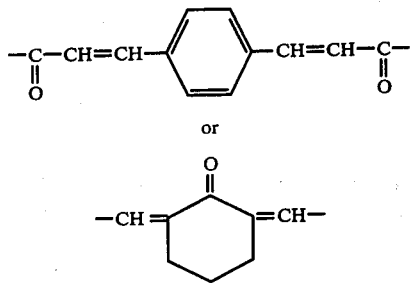         XXI or

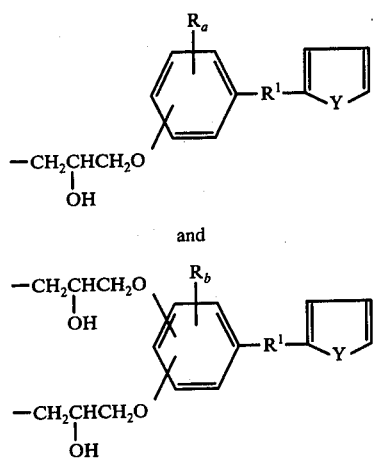         XXII and the units of formula XVII and XVIII are preferably further of the formulae

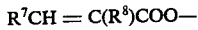         XVIIA and

XVIIIA respectively.

Preferably the esters of this invention also contain groups of the formula $R^7CH = C(R^8)COO—$         XXIII directly attached to carbon atoms, where $R^7$ represents a hydrogen atom or an aliphatic, aromatic, araliphatic, or heterocyclic group of 1 to 12 carbon atoms, especially a group having olefinic unsaturation or aromaticity in conjugation with the indicated ethylenic double bond, and $R^8$ represents a hydrogen, chlorine, or bromine atom, a cyano group, or an alkyl hydrocarbon group of 1 to 4 carbon atoms.

Especially preferred groups of formula XXIII are acrylyl, methacrylyl, 3-(styryl)acrylyl, 3-(2-furyl)acrylyl, 3-(2-pyridyl)acrylyl, 3-(3-pyridyl)acrylyl, cinnamyl, and sorbyl groups.

Such groups may be introduced by using, as the epoxide which is made to react with the phenol of any of formula IX to XIII to form the alcohol, a glycidyl ester of formula

         XXIV or, by using as the alcohol, an adduct of an acid of formula $R^7CH = C(R^8)COOH$         XXV with a glycidyl ether of formula

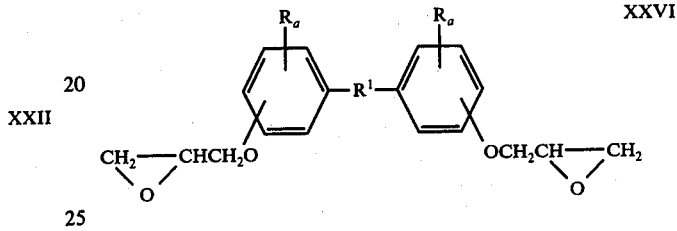         XXVI

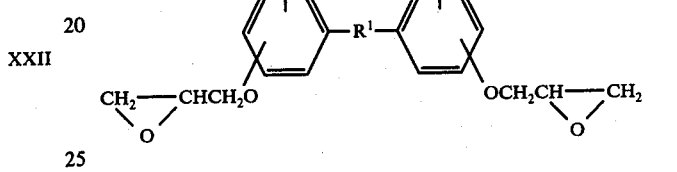         XXVII

XXVIII

XXIX or

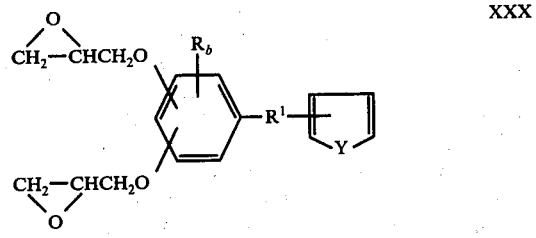         XXX where the symbols have the meanings previously assigned.

The glycidyl ethers of formulae XXIX and XXX are further preferably of the formulae

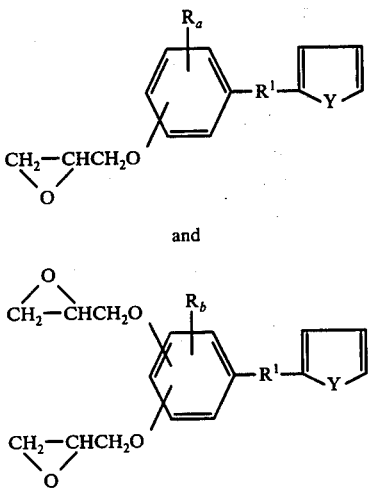

XXIXA and

XXXA respectively.

Glycidyl ethers of the type shown in formulae XXVI to XXX are described in German Offenlengungsschrift No. 2342407.

Reaction of the glycidyl ester of formula XXIV with the phenol of any of formulae IX to XIII, or of the acid of formula XXV with a glycidyl ether of any of the formulae XXVI to XXX, to form the alcohol is preferably similarly effected, i.e., using from 0.75 to 1.25 acid equivalents or phenolic hydroxyl equivalents per 1,2-epoxide equivalent of the coreactant, in an inert solvent (such as cyclohexanone), in the presence of a catalyst such as a tertiary amine or a quaternary ammonium compound, and heating for from one half to three hours at a temperature of from 80° to 150° C.

Preferably, too, the reaction is carried out in the presence of an inhibitor of free radicals, such as hydroquinone.

Numerous bases are suitable, as their aqueous solutions, for developing the irradiated ester. Solutions such as sodium hydroxide of normality from 2.5 to as low as 0.01 have given good results, as have 0.001 to 1 N aqueous solutions of ammonia, or solutions of triethanolamine (e.g., of 0.35 M): solutions of salts having an alkaline reaction, such as disodium hydrogen orthophosphate, may also be employed.

As prepared, the esters may contain small quantities of a hydroquinone or other free-radical inhibitor added to prevent free-radical polymerisation taking place during preparation of the ester. Such inhibitors are usually not deleterious since they maintain the stability of the ester during storage but do not prevent polymerisation on exposure to actinic radiation.

The esters of this invention are of particular value in the production of printing plates and printed circuits, especially multilayer printed circuits which can be prepared without removal of the photopolymerised ester. A layer of the ester may be applied to a support by coating the support with a solution of the ester in any convenient solvent, e.g., cyclohexanone, or a mixture of toluene and acetone or of toluene and ethyl methyl ketone, and allowing or causing the solvent to evaporate; the layer may be applied by dipping, spinning or spin-coating (a process in which the material is put on a plate which is then rotated at high speed to distribute the material over the plate), spraying, or by means of a roller.

This invention also includes a plate sensitive to actinic radiation comprising a support, which may be of, for example, paper, copper, aluminium or other metal, synthetic resin, or glass, carrying a layer of such an ester, also a support bearing upon its surface such an ester which has been polymerised by exposure to actinic radiation. It also provides a method of polymerising such an ester which comprises subjecting a plate carrying a layer of the ester to actinic radiation, optionally imagewise as through a negative, and removing the unpolymerised portions, if any, of the ester by dissolving them in an aqueous solution of a base.

In polymerising the esters of this invention, actinic radiation of wavelength 200 to 600 nm is preferably used.

If desired the ester may be exposed to actinic radiation in the presence of a sensitiser such as a quinone (specific examples of which are toluquinone, 2,6-dichloroquinone, 2,5-diphenylquinone, 1,2- and 1,4-naphthaquinone, and benzanthraquinone), a diphenylcarbinol (such as bis(4-dimethylaminophenyl) carbinol), a diphenylmethane, or a benzophenone (specific examples of which are Michler's ketone and bis(p-diethylamino)benzophenone), benzoin, and alkyl ethers of benzoin, such as its methyl ether.

The coating of the ester should be applied to the support so that, upon drying, its thickness will be in the range of from about 1 to 250 μm. The thickness of the polymerisable layer is a direct function of the thickness desired in the relief image, which will depend on the subject being reproduced and particularly on the extent of the areas to be etched. The wet polymer coating may be dried by air drying or by any other known drying technique, and the polymerisable system may then be stored until required for use.

The polymerisable coatings can be insolubilised by exposure to actinic radiation through an image-bearing transparency consisting of substantially opaque and transparent areas. Suitable sources of actinic radiation include carbon arcs, mercury vapour arcs, fluorescent lamps with phosphors emitting ultra-violet light, argon and xenon glow lamps, tungsten lamps, and photographic flood lamps. Of these, mercury vapour arcs, particularly sun lamps, fluorescent sun lamps, and metal halide lamps are most suitable. The time required for the exposure of an ester will depend upon a variety of factors which include, for example, the individual ester being utilised, the thickness of the coating, the type of light source, and its distance from the coating.

If appropriate, say, in the production of printed circuits where the support is of copper or of other suitable electrically-conducting metal, the exposed metal is etched in a conventional manner using, for example, ferric chloride, or ammonium persulphate solutions.

The esters may, if desired, be partially polymerised before applying it to the support, in order to improve the film-forming or mechanical properties of the irradiated product. Such a partial prepolymerisation can be effected by heating: it should not, however, proceed beyond the stage at which a correctly differentiated image is obtained on the plate when the plate is exposed. The ester may also be heated after exposure to actinic radiation to enhance the degree of polymerisation.

The following Examples illustrate the invention. Temperatures are in degrees Celsius and parts are by weight.

EXAMPLE 1

A mixture of 1,5-bis(4-hydroxyphenyl)penta-1,4-dien-3-one (26.6 g), epichlorohydrin (18.5 g), N-benzyldimethylamine (0.4 g), and cyclohexanone (45 g) was stirred at 120° for 3 hours, by which time the epoxide content was negligible.

The product was cooled to 60° and benzophenone-3,3',4,4'-tetracarboxylic acid dianhydride (referred to hereinafter as BTDA) (29.3 g), cyclohexanone (30 g), and N-benzyldimethylamine (0.3 g) were added. This mixture was again heated at 120° for 2 hours, by which time anhydride groups could no longer be detected by infrared spectroscopy.

A copper-clad laminate was coated with the composition and the solvent was evaporated by heating for about 5 minutes at 80° to leave a film about 10 μm thick. This film was irradiated for 10 minutes through a negative using a 500 watt medium pressure mercury lamp at a distance of 200 mm. After irradiation, the image was developed in an aqueous solution (0.01 N) of sodium hydroxide, the unexposed areas being washed away in a few seconds to leave a good relief image on the copper. The irradiated film was resistant to organic solvents - rubbing it twenty times with a cotton wool swab soaked in acetone, which is a standard test for ascertaining the solvent-resistance of coatings, did not affect it. The uncoated areas were then etched by means of aqueous ferric chloride solution (40% w/v FeCl$_3$) at 32°.

EXAMPLE 2

A mixture of 1,5-bis(4-hydroxyphenyl)penta-1,4-dien-3-one (12.5 g), glycidyl sorbate (15.6 g, having an epoxide content of 5.95 equiv./kg), tetramethylammonium chloride (0.1 g), hydroquinone (0.025 g), and 2-ethoxyethyl acetate (28 g) was stirred at 120° for 3 hours, by which time the epoxide content was negligible. This product was cooled to about 60° and BTDA (20 g), 2-ethoxyethyl acetate (20 g), and N-benzyldimethylamine (0.4 g) were added. The mixture was then stirred at 120° for 2 hours, by which time its anhydride content was negligible.

The composition was tested as described in Example 1. A good relief image was obtained after 5 minutes' irradiation followed by development in aqueous disodium hydrogen orthophosphate solution (0.35M).

EXAMPLE 3

A mixture of 16.8 g of the diglycidyl ether of 2,2-bis(4-hydroxyphenyl)propane (having an epoxide content of 5.2 equiv./kg), 1-phenyl-3-(4-hydroxyphenyl)-prop-1-en-3-one (20g), tetramethylammonium chloride (0.1 g), and cyclohexanone (37 g) was stirred at 120° for 3 hours.

The product, which had a negligible epoxide content, was cooled to about 60° and pyromellitic acid dianhydride (9.5 g), cyclohexanone (10 g), and N-benzyldimethylamine (0.5 g) were added. This mixture was again stirred at 120° for 2 hours, by which time the anhydride content was negligible.

The composition was tested as described in Example 1. After 15 minutes' irradiation an image was obtained and was developed in 0.01N aqueous sodium hydroxide solution.

EXAMPLE 4

The procedure of Example 3 was repeated, using a mixture of N,N'-diglycidyl-5,5-dimethylhydantoin (12.5 g), 1-phenyl-3-(4-hydroxyphenyl)prop-1-en-3-one (20.7 g), tetramethylammonium chloride (0.1 g), and cyclohexanone (33.5 g) and stirring for 4 hours in the first stage, and 13.5 g of BTDA, 14 g of cyclohexanone, and 0.5 g of N-benzyl-dimethylamine in the second.

The composition was tested as described in Example 1. A good relief image was obtained after 15 minutes' irradiation and development in aqueous disodium hydrogen orthophosphate solution (0.35M). A similar result was obtained after 5 minutes' irradiation followed by development in 0.01N aqueous sodium hydroxide solution.

EXAMPLE 5

A mixture of 1,5-bis(4-hydroxyphenyl)penta-1,4-dien-3-one (20 g), glycidyl methacrylate having an epoxide content of 7.36 equiv./kg (20.4 g), tetramethylammonium chloride (0.2 g), hydroquinone (0.05 g), and 2-ethoxyethyl acetate (46.6 g) was stirred at 120° for 3 hours, by which time the epoxide content was negligible. This product was cooled to about 60° and BTDA (22 g), 2-ethoxyethyl acetate (22 g), hydroquinone (0.05 g), and N-benzyldimethylamine (0.7 g) were added. The mixture was then stirred at 120° for 2 hours, by which time its anhydride content was negligible.

The composition was tested as described in Example 1. A good relief image was obtained after 6 minutes' irradiation followed by development in aqueous disodium hydrogen orthophosphate solution (0.35M).

EXAMPLE 6

A mixture of 1,5-bis(4-hydroxyphenyl)penta-1,4-dien-3-one (20 g), allyl glycidyl ether, having an epoxide content of 7.7 equiv./kg (19.5 g), tetramethylammonium chloride (0.2 g), hydroquinone (0.05 g), and 2-ethoxyethyl acetate (39.5 g) was stirred at 120° for 4 hours, by which time the epoxide content was 0.7 equiv./kg. The product was cooled to about 60° and BTDA (22 g), 2-ethoxyethyl acetate (22 g), and N-benzyldimethylamine (0.7g) were added. The mixture was then stirred at 120° for 2 hours, by which time its anhydride content was negligible.

The composition was tested in Example 1. A relief image was obtained after 6 minutes' irradiation followed by development in aqueous disodium hydrogen orthophosphate (0.35M).

EXAMPLE 7

A mixture of 28.2 g of the diglycidyl ether of 1,5-bis(4-hydroxyphenyl)penta-1,4-dien-3-one (having an epoxide content of 5.14 equiv./kg), 3-(2-furyl)acrylic acid (20 g), tetramethylammonium chloride (0.2 g), hydroquinone (0.05 g), and 2-ethoxyethyl acetate (48.2 g) was stirred at 120° for 3 hours, by which time the epoxide content was negligible. The product was cooled to 60° and BTDA (23.2 g), 2-ethoxyethyl acetate (23.2 g), and N-benzyldimethylamine (0.7 g) were added. This mixture was again stirred at 120° for 2 hours, by which time the anhydride content was negligible. To the composition were added 71.4 g of 2-ethoxyethyl acetate and 50 g of 2-methoxyethanol and the mixture was tested as described in Example 1. A good relief image was obtained after 6 minutes' irradiation followed by development in aqueous disodium hydrogen orthophosphate solution (0.35M).

EXAMPLE 8

A mixture of 1,3-bis(4-hydroxyphenyl)prop-1-en-3-one (24.0 g), epichlorohydrin (18.5 g), N-benzyldimethylamine (0.4 g), and cyclohexanone (43 g) was stirred at 120° for 3 hours, by which time its epoxide content was negligible.

The product was cooled to 60° and BTDA (29.3 g), cyclohexanone (30 g), and N-benzyldimethylamine (0.3 g) were added. This mixture was again heated at 120° for 2 hours.

The composition had a viscosity of 32,000 cP at 22° (Brookfield RVT viscometer, Spindle number 5).

The composition was tested as described in Example 1. A good relief image was obtained after 20 minutes' irradiation followed by development in aqueous disodium hydrogen orthophosphate solution (0.35M).

EXAMPLE 9

A mixture of 9 g of the diglycidyl ether of 2,2-bis(4-hydroxyphenyl)propane (having an epoxide content of 5.3 equiv./kg), 1-(2-furyl)-3-(4-hydroxyphenyl)prop-1-en-3-one (10.2 g), tetramethylammonium chloride (0.07 g), and cyclohexanone (20 g) was stirred at 120° for 3 hours, by which time its epoxide content was negligible.

The product was cooled to 60° and BTDA (7.6 g), cyclohexanone (10 g), and N-benzyldimethylamine (0.3 g) were added. The mixture was again stirred at 120° for 2 hours, and its viscosity was then 5,600 cP at 29° (Brookfield RVT viscometer; spindle number 5).

The composition was tested as described in Example 1. After 10 minutes' irradiation a good relief image was obtained and was developed in aqueous disodium hydrogen orthophosphate solution (0.35 M).

EXAMPLE 10

A mixture of 1,4-bis(4-hydroxybenzoylvinyl)benzene (30.6 g), epichlorohydrin (18.5 g), N-benzyldimethylamine (0.5 g), and cyclohexanone (50 g) was stirred at 120° for 3½ hours, by which time its epoxide content was negligible.

The product was cooled to 60° and BTDA (29.3 g), cyclohexanone (30 g), and N-benzyldimethylamine (0.3 g) were added. This mixture was again heated at 120° for 2 hours and its viscosity was then 25,000 cP at 25° (Brookfield RVT viscometer; Spindle number 6).

The composition was tested as described in Example 1. A relief image was obtained after 20 minutes' irradiation followed by development in aqueous disodium hydrogen orthophosphate (0.34 M).

I claim:

1. An ester as a composition of matter, which is soluble in an aqueous solution of a base before exposure to actinic radiation, but which polymerizes on exposure to actinic radiation and becomes insoluble in said aqueous solution, which comprises the condensation product of
    (A) the reaction product of
        (1) a phenol of the formula

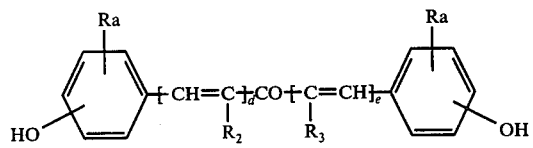

each R represents a halogen atom, an alkyl, cycloalkyl, alkenyl, cycloalkenyl, alkoxy, alkenoxy, carbalkoxy, carbalkenoxy, carbocycloalkoxy, or carbocycloalkenoxy group of 1 to 9 carbon atoms or a nitro group, each $a$ represents zero or an integer of 1 to 4, $R^2$ and $R^3$ individually are each a hydrogen atom, an alkyl group of 1 to 4 carbon atoms, or a phenyl group, or conjointly denote a polymethylene chain of 2 to 4 methylene groups, $d$ and $e$ are each zero, 1, or 2, with the proviso that they are not both zero, and (2) a compound containing a 1,2-epoxy group selected from the group consisting of ethylene oxide, propylene oxide and epichlorohydrin, said phenol (1) and 1,2-epoxy compound (2) being reacted at a temperature of 80° to 150° C. in the presence of an inert solvent, a free-radical polymerization inhibitor and a ring opening catalyst selected from the group consisting of a tertiary amine and a quaternary ammonium compound, and in a ratio of from 0.75 to 1.25 phenolic hydroxyl equivalents per each 1,2-epoxide group in the epoxy coreactant, with (B) a dianhydride selected from the group consisting of benzophenone-3,3',4,4'-tetracarboxylic acid dianhydride and pyromellitic acid dianhydride, said reaction product (A) and the dianhydride (B) being reacted at a temperature of 80°–150° C. in an inert solvent and with a tertiary amine esterification catalyst, and in a ratio of 0.7 to 1.2 carboxylic acid anhydride equivalents of the anhydride for each hydroxyl group of product (A).

2. An ester according to claim 1 wherein the phenol (1) has the formula

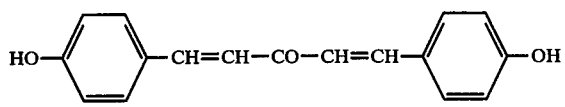

or

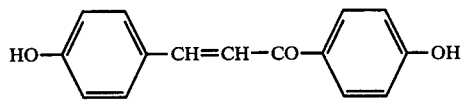

3. An ester according to claim 1 wherein the acid dianhydride (B) is benzophenone-3,3',4,4'-tetracarboxylic acid dianhydride.

4. An ester according to claim 1 wherein the 1,2-epoxy compound (2) is epichlorohydrin.

5. An ester according to claim 1 which comprises the condensation product of (A) the reaction product of
    (1) a phenol of the formula

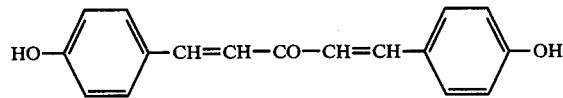

or

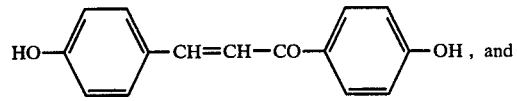

epichlorohydrin, with (B) a dianhydride selected from the group consisting of benzophenone-3,3',4,4'-tetracarboxylic acid dianhydride and pyromellitic acid dianhydride.

6. An ester according to claim 5 which comprises the condensation product of (A) the reaction product of
(1) a phenol of the formula

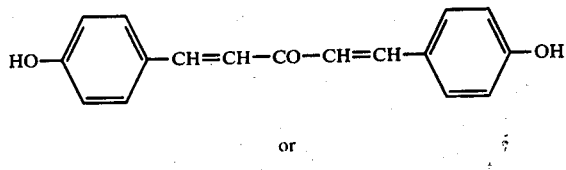

or

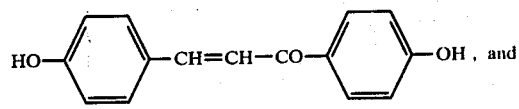, and epichlorohydrin, with
(B) benzophenone-3,3',4,4'-tetracarboxylic acid dianhydride.

7. An ester according to claim 1 which comprises the condensation product of (A) the reaction product of the phenol (1)

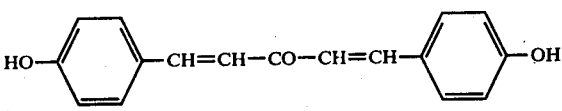

and (2) epichlorohydrin, with
(B) benzophenone-3,3',4,4'-tetracarboxylic acid dianhydride.

8. An ester according to claim 1 which comprises the condensation product (A) of the reaction product of the phenol (1)

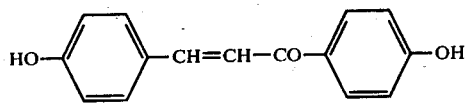

and (2) epichlorohydrin, with (B) benzophenone-3,3',4,4'-tetracarboxylic acid dianhydride.

* * * * *